(12) United States Patent
Lai et al.

(10) Patent No.: US 7,645,649 B1
(45) Date of Patent: Jan. 12, 2010

(54) METHOD FOR FABRICATING PIXEL STRUCTURE

(75) Inventors: Che-Yung Lai, Taichung County (TW); Zong-Long Jhang, Taichung (TW); Chia-Chi Tsai, Taipei (TW); Chen-Pang Tung, Taipei (TW); Chia-Ming Chang, Taipei County (TW); Chun-Yi Chiang, Taichung (TW); Chou-Huan Yu, Taichung County (TW); Hsiang-Chih Hsiao, Keelung (TW); Han-Tang Chou, Taoyuan County (TW); Jun-Kai Chang, Chiayi (TW); Ta-Wen Liao, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/242,938

(22) Filed: Oct. 1, 2008

(30) Foreign Application Priority Data

Jul. 7, 2008 (TW) .............................. 97125584 A

(51) Int. Cl.
*H01L 21/00* (2006.01)
(52) U.S. Cl. .................. 438/151; 438/30; 438/149; 438/155
(58) Field of Classification Search .................. 438/29, 438/30, 149, 151, 152, 155, 157, 158, 161, 438/164; 349/43, 44
See application file for complete search history.

(56) References Cited

U.S. PATENT DOCUMENTS

| | | | |
|---|---|---|---|
| 5,919,532 A | 7/1999 | Sato et al. | |
| 6,744,486 B2 * | 6/2004 | Kim et al. | 438/149 |
| 6,873,382 B2 * | 3/2005 | Chang et al. | 349/106 |
| 7,005,331 B2 * | 2/2006 | Chen | 438/158 |
| 7,041,522 B2 | 5/2006 | Tanaka et al. | |
| 7,075,110 B2 * | 7/2006 | Kim | 257/72 |
| 7,375,373 B2 * | 5/2008 | Lee et al. | 438/154 |
| 7,423,712 B2 * | 9/2008 | Jeoung et al. | 349/114 |
| 2002/0089615 A1 | 7/2002 | Sakamoto et al. | |
| 2006/0186411 A1 | 8/2006 | Kim et al. | |
| 2007/0109467 A1 | 5/2007 | Chang et al. | |

* cited by examiner

*Primary Examiner*—Kevin M Picardat
(74) *Attorney, Agent, or Firm*—Jianq Chyun IP Office

(57) ABSTRACT

A pixel structure fabricating method is provided. A gate and a gate insulation layer covering the gate are formed on a substrate. A channel layer is formed on the gate insulation layer. A conductive layer is formed on the channel layer and gate insulation layer. A black matrix having a color filer layer accommodating opening is formed on the conductive layer. The black matrix includes a first block and a second block which is thicker than the first block. The conductive layer is patterned with the black matrix as a mask to form a source and a drain on the channel layer. A color filter layer is formed within the color filter layer accommodating opening through inkjet printing. A dielectric layer is formed on the black matrix and color filter layer. The dielectric layer is patterned to expose the drain. A pixel electrode electrically connected to the drain is formed.

13 Claims, 22 Drawing Sheets

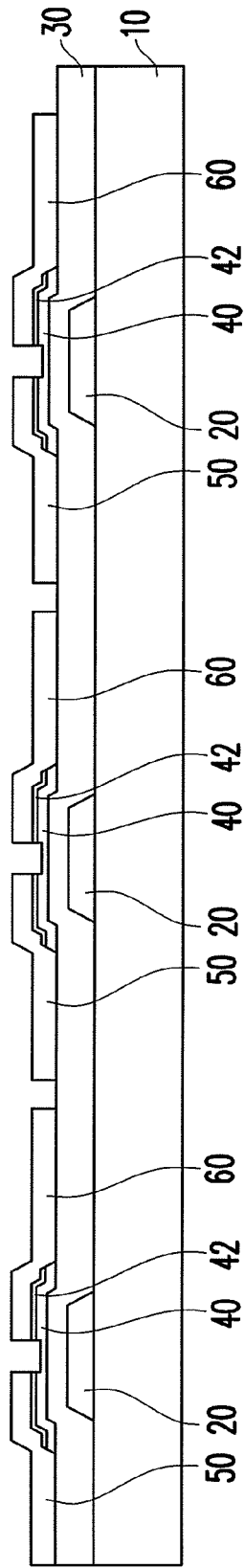
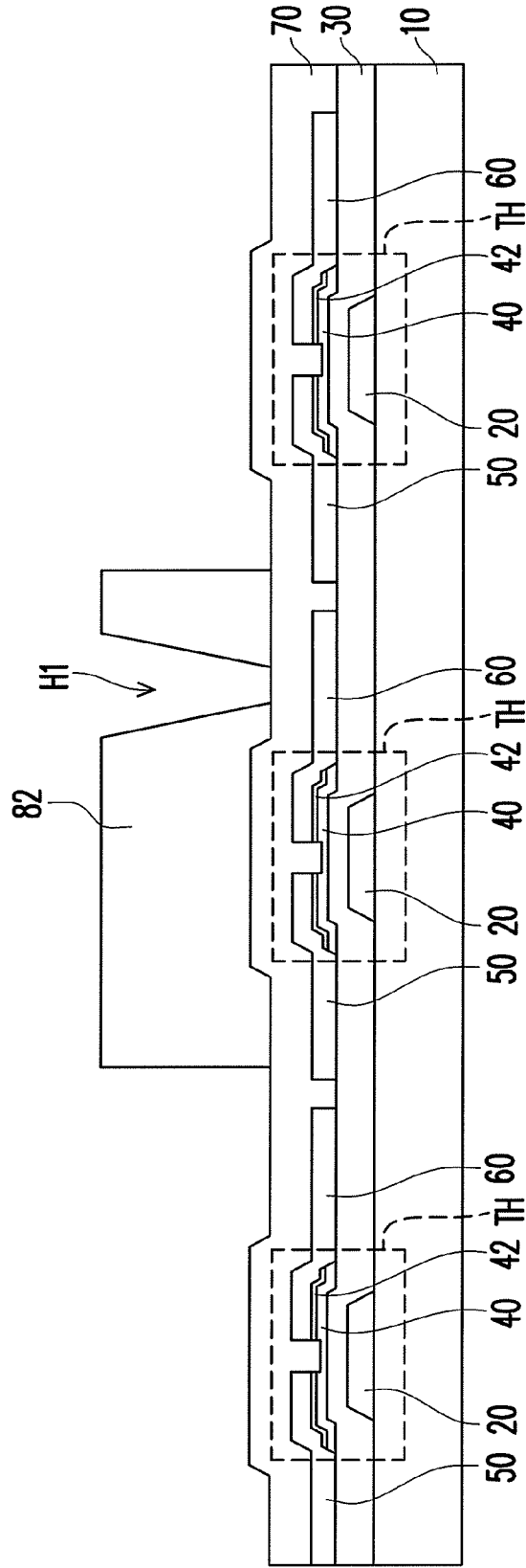
FIG. 1C (PRIOR ART)
FIG. 1D (PRIOR ART)

METHOD FOR FABRICATING PIXEL STRUCTURE

CROSS-REFERENCE TO RELATED APPLICATION

This application claims the priority benefit of Taiwan application serial no. 97125584, filed on Jul. 7, 2008. The entirety of the above-mentioned patent application is hereby incorporated by reference herein and made a part of this specification.

BACKGROUND OF THE INVENTION

1. Field of the Invention

The present invention generally relates to a method for fabricating a pixel structure, and more particularly, to a method for fabricating a pixel structure having a color filter layer through photo engraving processes (PEP).

2. Description of Related Art

Liquid crystal display (LCD) has replaced cathode ray tube (CRT) display as the mainstream in the display market because it has such advantages as high image quality, small volume, light weight, low driving voltage, low power consumption, and broad application, etc. A conventional LCD panel is composed of a color filter substrate having a color filter layer, a thin film transistor (TFT) array substrate, and a liquid crystal layer disposed between foregoing two substrates. In order to increase the resolution of the LCD panel and the aperture ratio of the pixels and to avoid alignment error between the color filter substrate and the TFT array substrate, a technique for integrating the color filter layer directly into the TFT array substrate (color filter on array, COA) is further provided.

FIGS. 1A~1G are diagrams illustrating a conventional technique for forming a color filter layer on a TFT array substrate, wherein three pixel structures are illustrated as examples. First, referring to FIG. 1A, a substrate 10 is provided, and a gate 20 is formed on the substrate 10 through a first photo engraving process (PEP). Then, referring to FIG. 1B, a gate insulation layer 30 is formed on the substrate 10 to cover the gate 20, and a channel layer 40 and an ohmic contact layer 42 are formed on the gate insulation layer 30 above the gate 20 through a second PEP. Next, referring to FIG. 1C, a source 50 and a drain 60 are formed on part of the channel layer 40 and part of the gate insulation layer 30 through a third PEP. Generally speaking, the channel layer 40 is made of amorphous silicon (a-Si), and the ohmic contact layer 42 is made of N-type heavily-doped a-Si such that the contact resistance between the channel layer 40 and the source 50 and the contact resistance between the channel layer 40 and the drain 60 can be reduced. The ohmic contact layer 42 is formed by performing N-type ion doping on the surface of a-Si.

Referring to FIG. 1C again, the source 50 and the drain 60 are respectively extended from both sides of the channel layer 40 onto the gate insulation layer 30 and expose parts of the channel layer 40, wherein the gate 20, the channel layer 40, the source 50, and the drain 60 form a TFT TH. Then, referring to FIG. 1D, a dielectric layer 70 covering the TFT TH is formed, and a red color filter pattern 82 is formed above the TFT TH through a fourth PEP, wherein the red color filter pattern 82 has a contact opening H1 which is located above the drain 60 of the TFT TH corresponding to the red color filter pattern 82.

After that, referring to FIG. 1E, a green color filter pattern 84 is formed above part of the TFT TH through a fifth PEP, and a contact opening H2 is formed within the green color filter pattern 84, wherein the contact opening H2 is located above the drain 60 of the TFT TH corresponding to the green color filter pattern 84. Next, referring to FIG. 1F, a blue color filter pattern 86 is formed above the remaining TFT TH through a sixth PEP, and a contact opening H3 is formed within the blue color filter pattern 86, wherein the contact opening H3 is located above the drain 60 of the TFT TH corresponding to the blue color filter pattern 86. As shown in FIGS. 1D~1F, the color filter layer 80 composed of the red color filter pattern 82, the green color filter pattern 84, and the blue color filter pattern 86 is fabricated through three PEPs.

Thereafter, referring to FIG. 1G, the dielectric layer 70 exposed by the contact openings H1, H2, and H3 is removed through an etching process. After that, a pixel electrode 90 is formed on the color filter layer 80 through a seventh PEP. As shown in FIG. 1G, the pixel electrodes 90 of the pixel structures are electrically connected to the corresponding drains 60 respectively through the contact openings H1, H2, and H3. By now, the process for directly integrating the color filter layer 80 into the TFT array substrate is completed.

As described above, the conventional method for fabricating a color filter layer on a TFT array substrate requires at least seven PEPs therefore is very complicated and requires very high fabricating cost. In addition, masks having different patterns are required for fabricating the pixel structure through foregoing at least seven PEPs, and accordingly, the fabricating cost of the pixel structure cannot be reduced due to the high cost of these masks.

SUMMARY OF THE INVENTION

Accordingly, the present invention is directed to a method for fabricating a pixel structure, wherein the fabricating cost of the pixel structure is reduced.

The present invention provides a method for fabricating a pixel structure. First, a gate is formed on a substrate. Then, a gate insulation layer is formed on the substrate to cover the gate. Next, a channel layer is formed on the gate insulation layer. After that, a conductive layer is formed on the channel layer and the gate insulation layer. Next, a photosensitive black matrix is formed on the conductive layer, wherein the photosensitive black matrix has a color filter layer accommodating opening and includes a first block and a second block, and the thickness of the first block is smaller than that of the second block. Thereafter, the conductive layer is patterned with the photosensitive black matrix as a mask to form a source and a drain on the channel layer, wherein the gate, the channel layer, the source, and the drain form a thin film transistor (TFT). After that, a color filter layer is formed within the color filter layer accommodating opening through an inkjet printing process. Then, a dielectric layer is formed on the photosensitive black matrix and the color filter layer. Thereafter, the dielectric layer is patterned to expose the drain. Next, a pixel electrode electrically connected to the drain is formed.

According to an embodiment of the present invention, the pixel structure fabricating method further includes forming a protecting layer on the photosensitive black matrix, the TFT, and the gate insulation layer.

According to an embodiment of the present invention, the step for patterning the conductive layer includes following steps. First, part of the conductive layer not covered by the photosensitive black matrix is removed with the photosensitive black matrix as a mask to form the source and the drain on the channel layer. Then, the thickness of the photosensitive black matrix is reduced until the first block is completely removed.

According to an embodiment of the present invention, the step of removing part of the conductive layer not covered by the photosensitive black matrix includes performing a wet etching process.

According to an embodiment of the present invention, the step of reducing the thickness of the photosensitive black matrix includes performing a dry etching process.

According to an embodiment of the present invention, the dry etching process includes an ashing process.

According to an embodiment of the present invention, the step of forming the channel layer includes forming a semiconductor material layer on the gate insulation layer and patterning the semiconductor material layer to form a semiconductor layer.

According to an embodiment of the present invention, the pixel structure fabricating method further includes forming an ohmic contact layer on the semiconductor layer.

According to an embodiment of the present invention, the step of patterning the dielectric layer includes forming a photoresist layer on the dielectric layer and removing part of the dielectric layer and part of the photosensitive black matrix with the photoresist layer as a mask to respectively form a first opening and a second opening in the dielectric layer and the photosensitive black matrix.

According to an embodiment of the present invention, the step of forming the pixel electrode includes forming an electrode material layer on the dielectric layer, the photosensitive black matrix and the drain and, patterning the electrode material layer.

According to an embodiment of the present invention, a first capacitance electrode is further formed while forming the gate, a second capacitance electrode is further formed while forming the source and the drain, and the first capacitance electrode and the second capacitance electrode form a storage capacitor.

In the present invention, a color filter layer is fabricated above a TFT through an inkjet printing process. Thereby, compared to the conventional method for fabricating a pixel structure, the method in the present invention offers a simplified process and reduced fabricating cost of masks. In addition, the material used for forming the color filter layer can be effectively reduced by forming the color filter layer through the inkjet printing process, and accordingly the fabricating cost of the pixel structure can be further reduced. Moreover, in the present invention, the conductive layer is etched with a photosensitive black matrix as a mask. Thus, fewer PEPs are performed in the present invention and accordingly the fabricating cost of the pixel structure is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A~1G are diagrams illustrating a conventional technique for forming a color filter layer on a TFT array substrate, wherein three pixel structures are illustrated as examples.

DESCRIPTION OF THE EMBODIMENTS

Figure 1A:
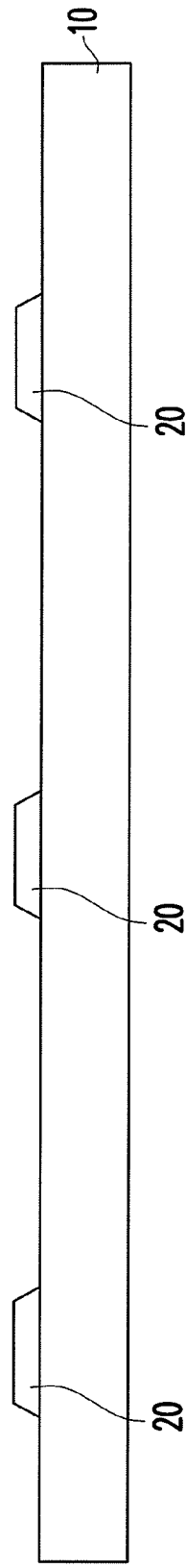
Figure 1B:
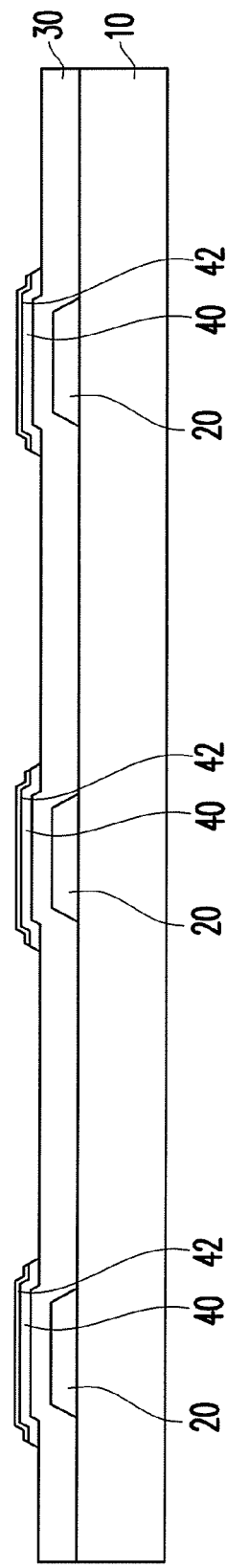
Figure 1E:
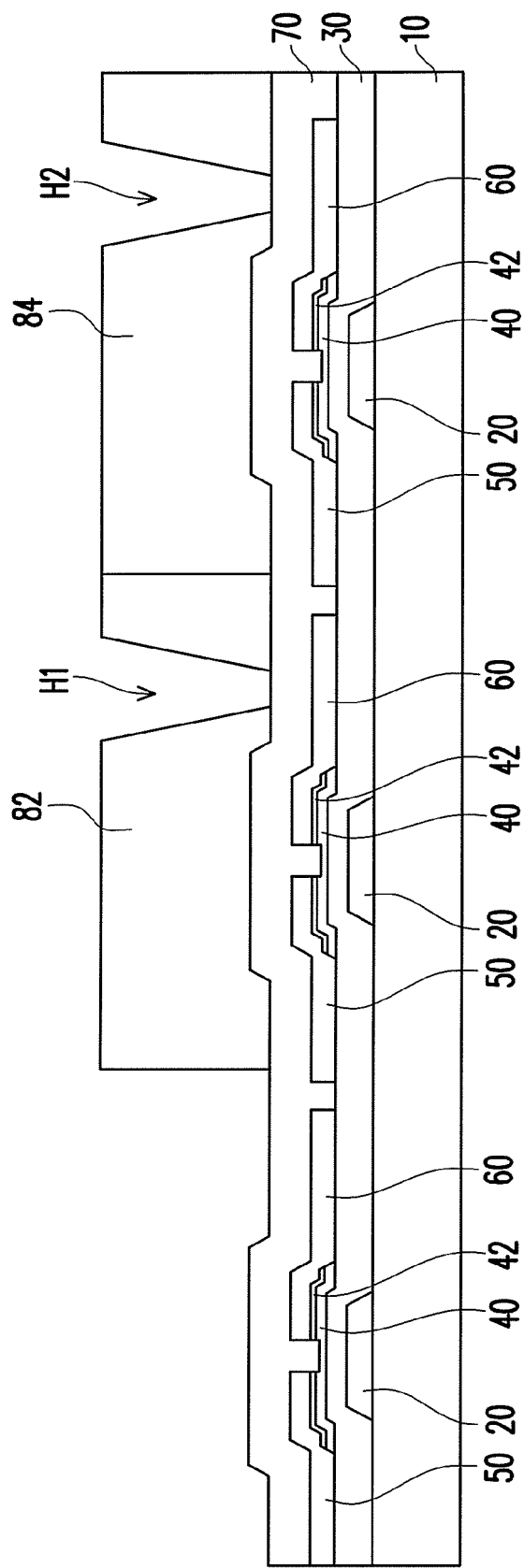
Figure 1F:
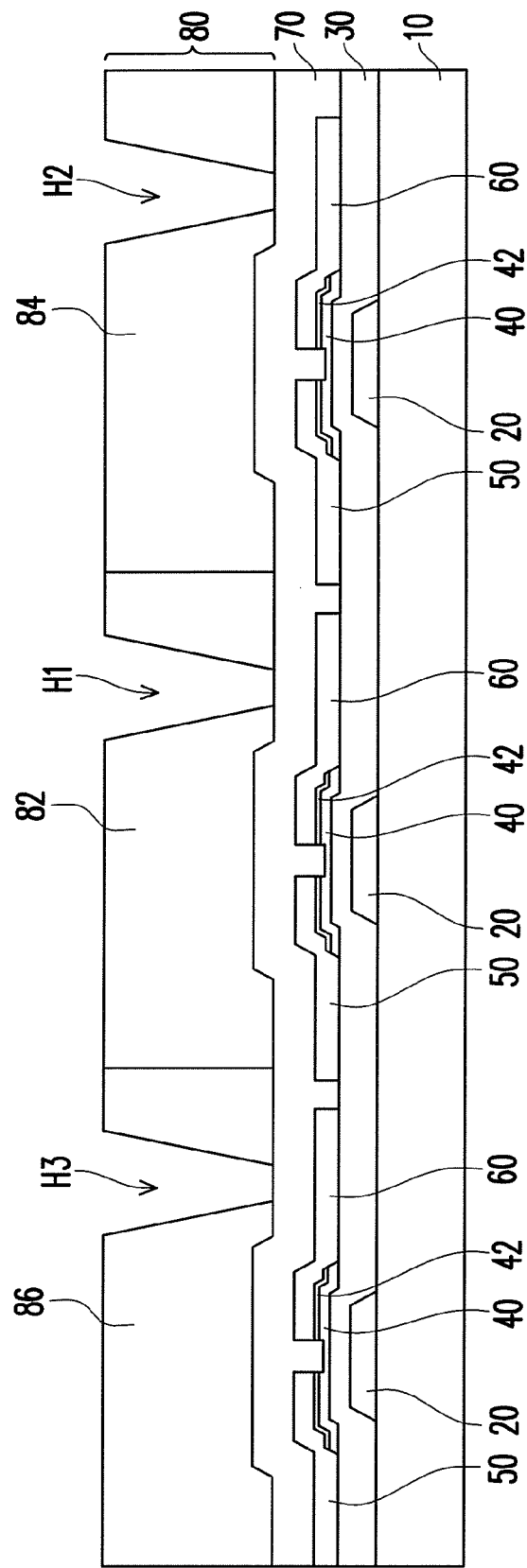
Figure 1G:
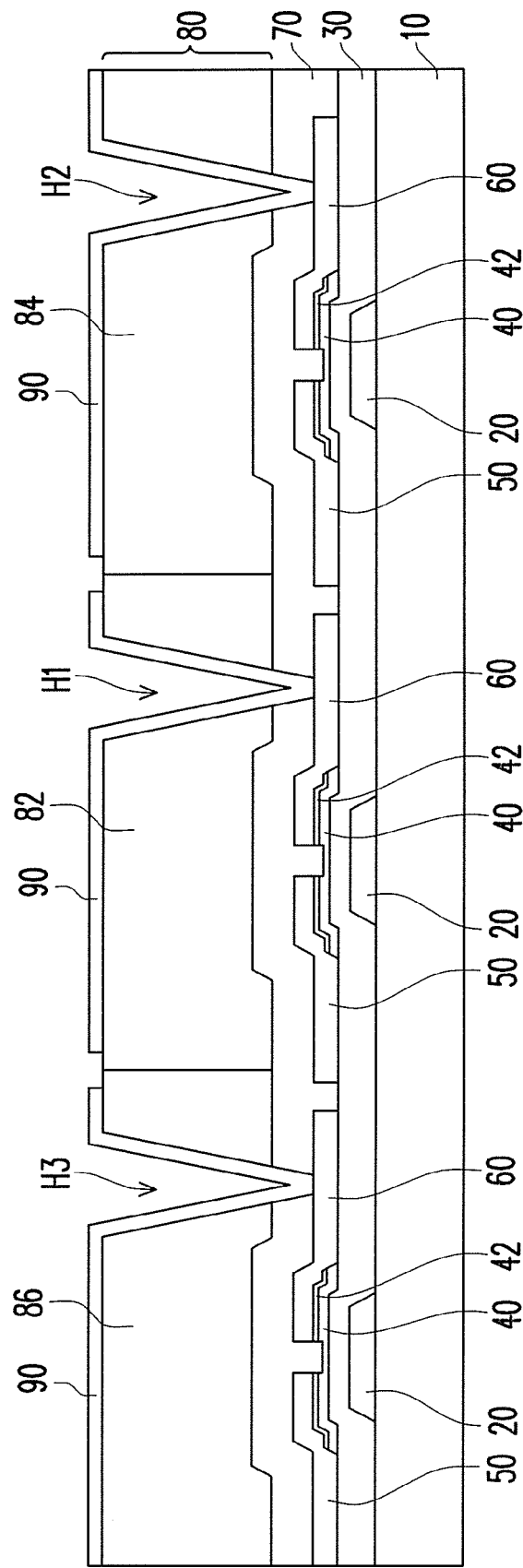

Reference will now be made in detail to the present preferred embodiments of the invention, examples of which are illustrated in the accompanying drawings. Wherever possible, the same reference numbers are used in the drawings and the description to refer to the same or like parts.

FIGS. 2A~2J are cross-sectional views illustrating a method for fabricating a pixel structure according to an embodiment of the present invention. FIGS. 3A~3F are respectively top views of FIG. 2A, FIG. 2B, FIG. 2E, FIG. 2G, FIG. 2I, and FIG. 2J.

Figure 2A:
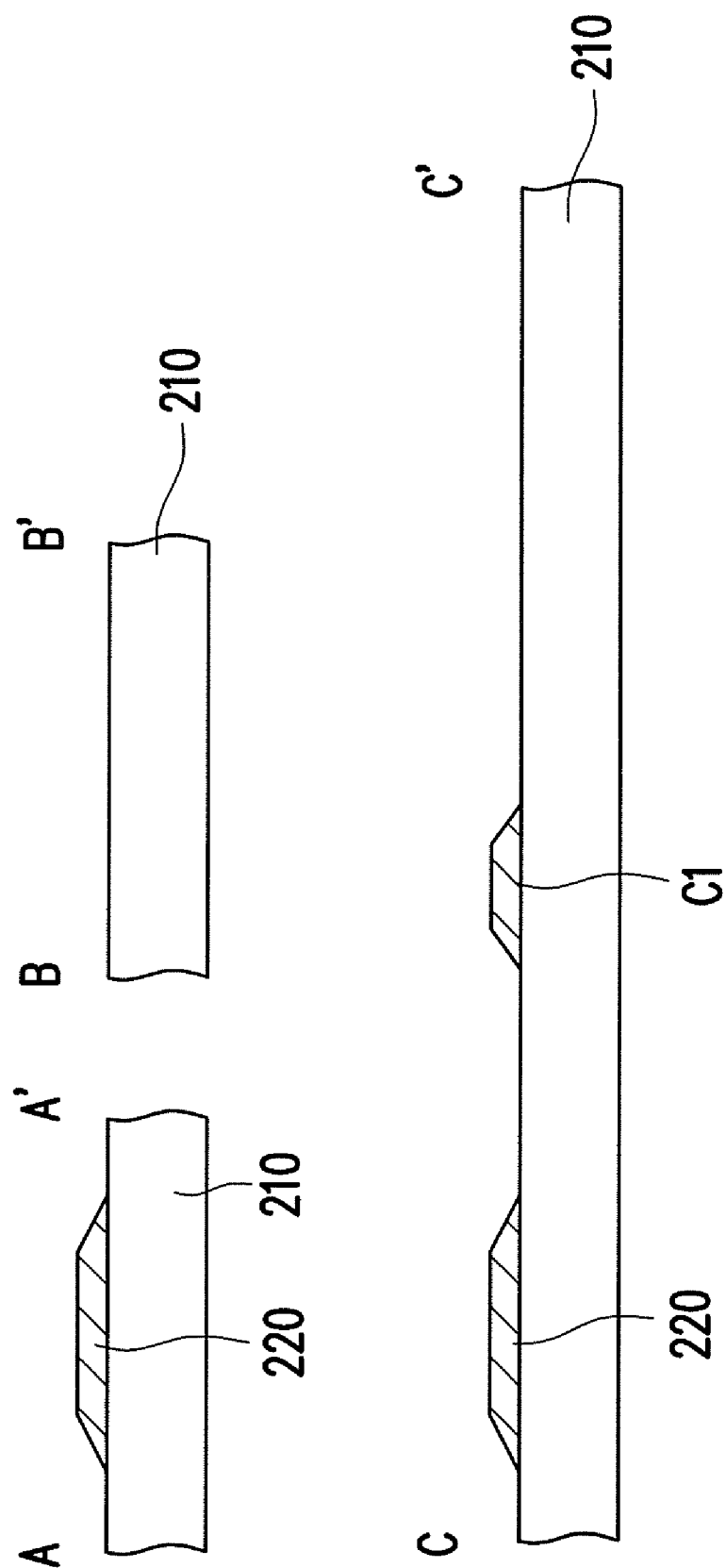
FIGS. 2A~2J are cross-sectional views illustrating a method for fabricating a pixel structure according to an embodiment of the present invention.
Figure 3A:
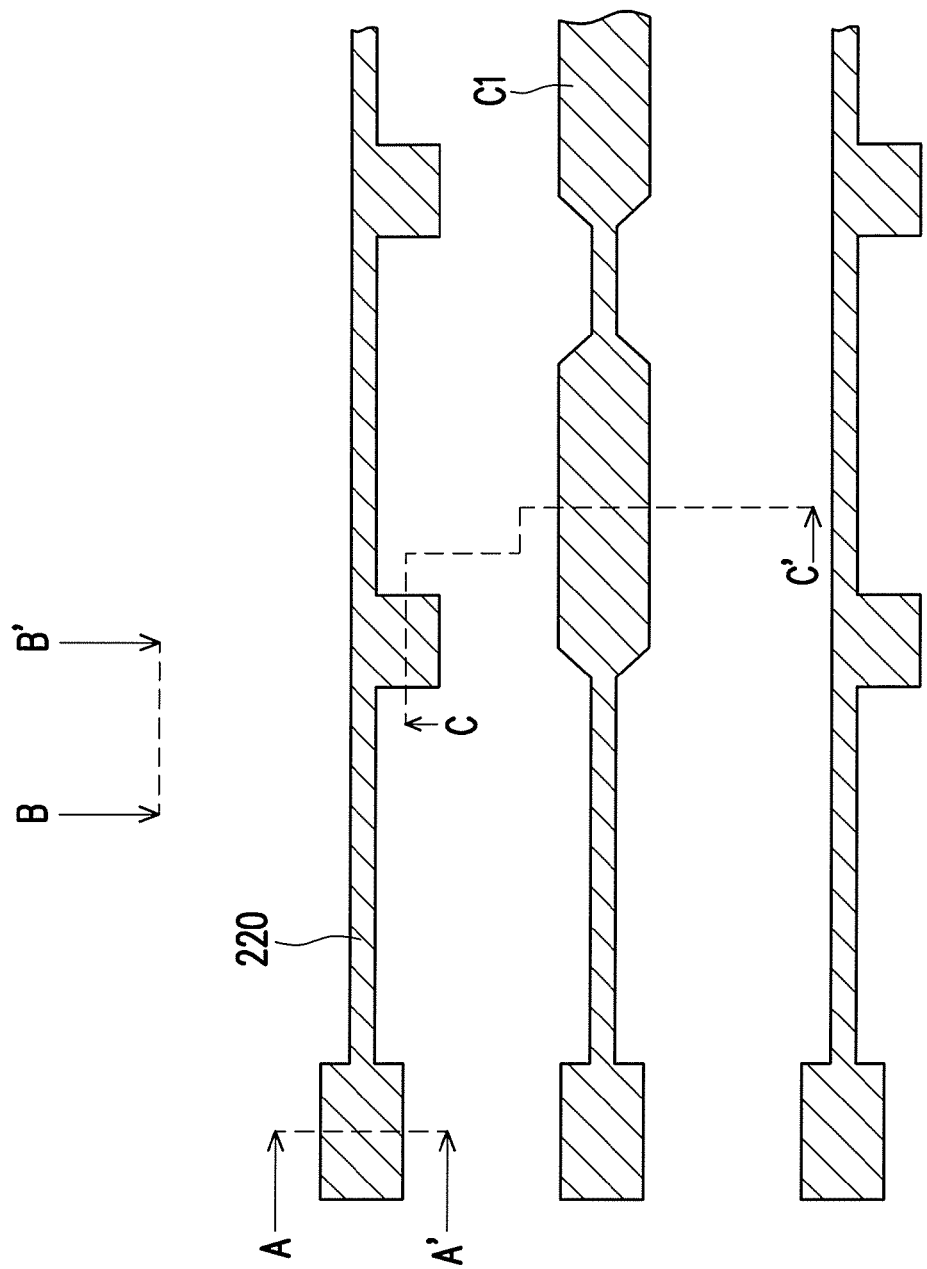
FIGS. 3A~3F are respectively top views of FIG. 2A, FIG. 2B, FIG. 2E, FIG. 2G, FIG. 2I, and FIG. 2J.

Referring to both FIG. 2A and FIG. 3A, first, a substrate 210 is provided, wherein the substrate 210 may be a hard substrate or a soft substrate made of glass or plastic. Then, a gate 220 is formed on the substrate 210. The gate 220 may be formed by forming a conductive layer (not shown) on the substrate 210 first and then patterning the conductive layer, wherein the conductive layer may be formed through sputtering, evaporation, or other suitable film deposition techniques, and the conductive layer may be patterned through a photo engraving process (PEP) or photolithography etching process. In addition, in the present embodiment, a first capacitance electrode C1 may be selectively formed while forming the gate 220.

Figure 2B:
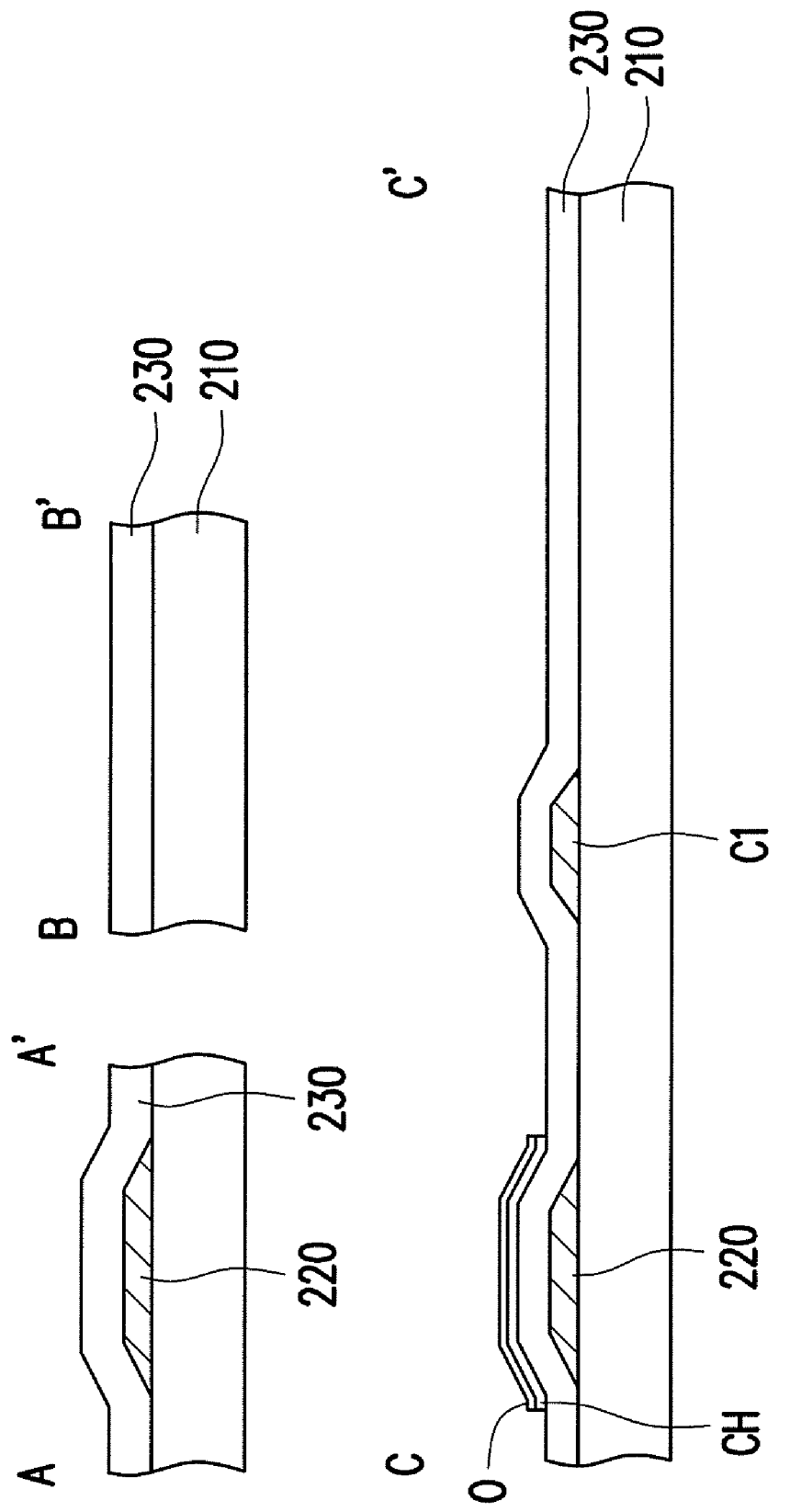
Figure 3B:
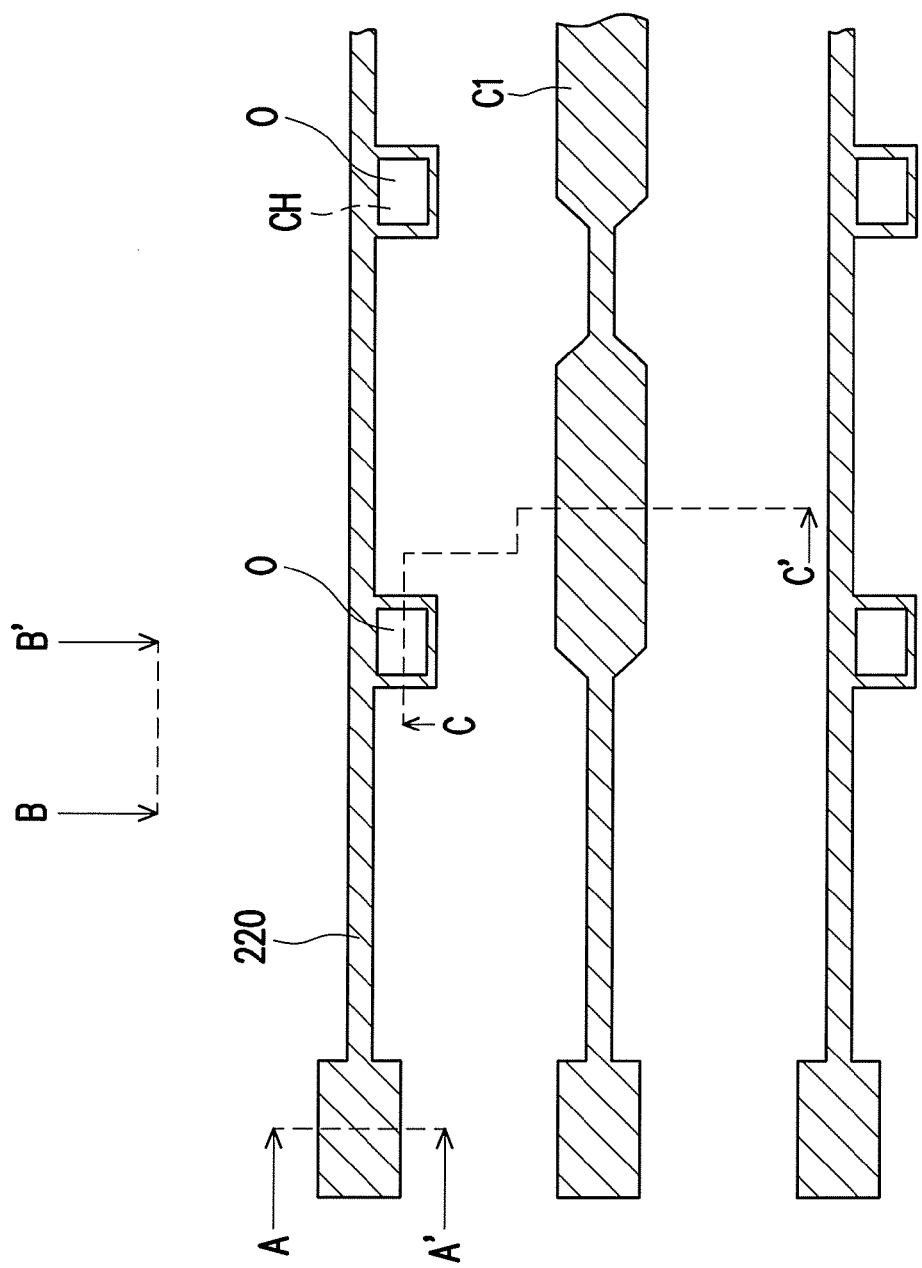

Next, referring to FIG. 2B and FIG. 3B, a gate insulation layer 230 covering the gate 220 and the first capacitance electrode C1 is formed on the substrate 210. The gate insulation layer 230 may be formed through chemical vapour deposition (CVD) or other suitable film deposition techniques, and the gate insulation layer 230 may be made of a dielectric material, such as SiO, SiN, and SiON. After that, referring to FIG. 2B and FIG. 3B again, a channel layer CH is formed on the gate insulation layer 230, wherein the channel layer CH may be made of amorphous silicon (a-Si) or other suitable semiconductor materials. The channel layer CH may be formed by forming a semiconductor material layer (not shown) on the gate insulation layer 230 and then patterning the semiconductor material layer to form a semiconductor layer (i.e., the channel layer CH).

In addition, as shown in FIG. 2B and FIG. 3B, in order to reduce the contact resistances between the channel layer CH and the source and drain formed subsequently, in the present embodiment, an ohmic contact layer O may be further formed selectively on the channel layer CH when the channel layer CH is formed, wherein the ohmic contact layer O may be made of N-type heavily-doped a-Si.

Figure 2C:
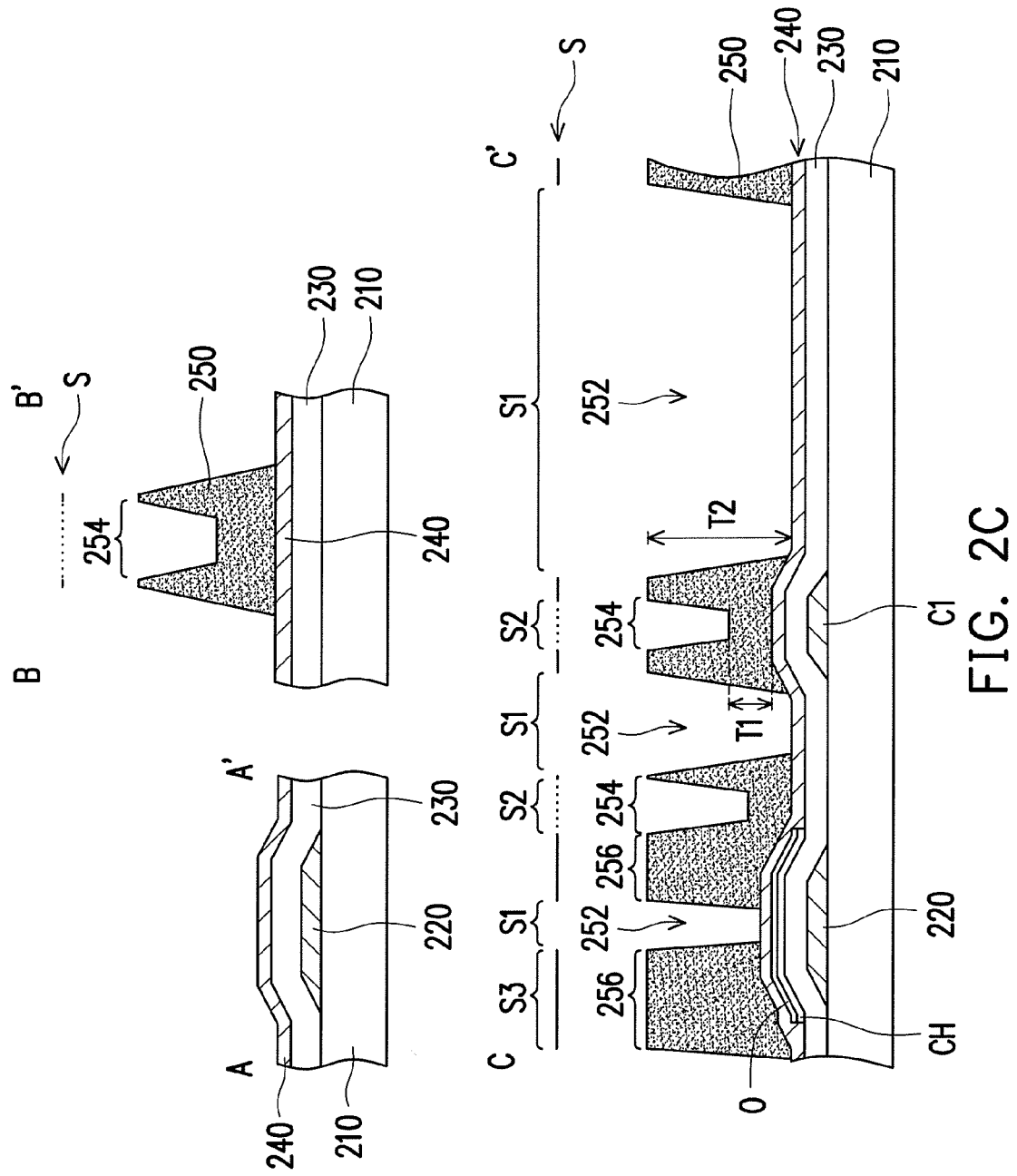
Figure 2D:
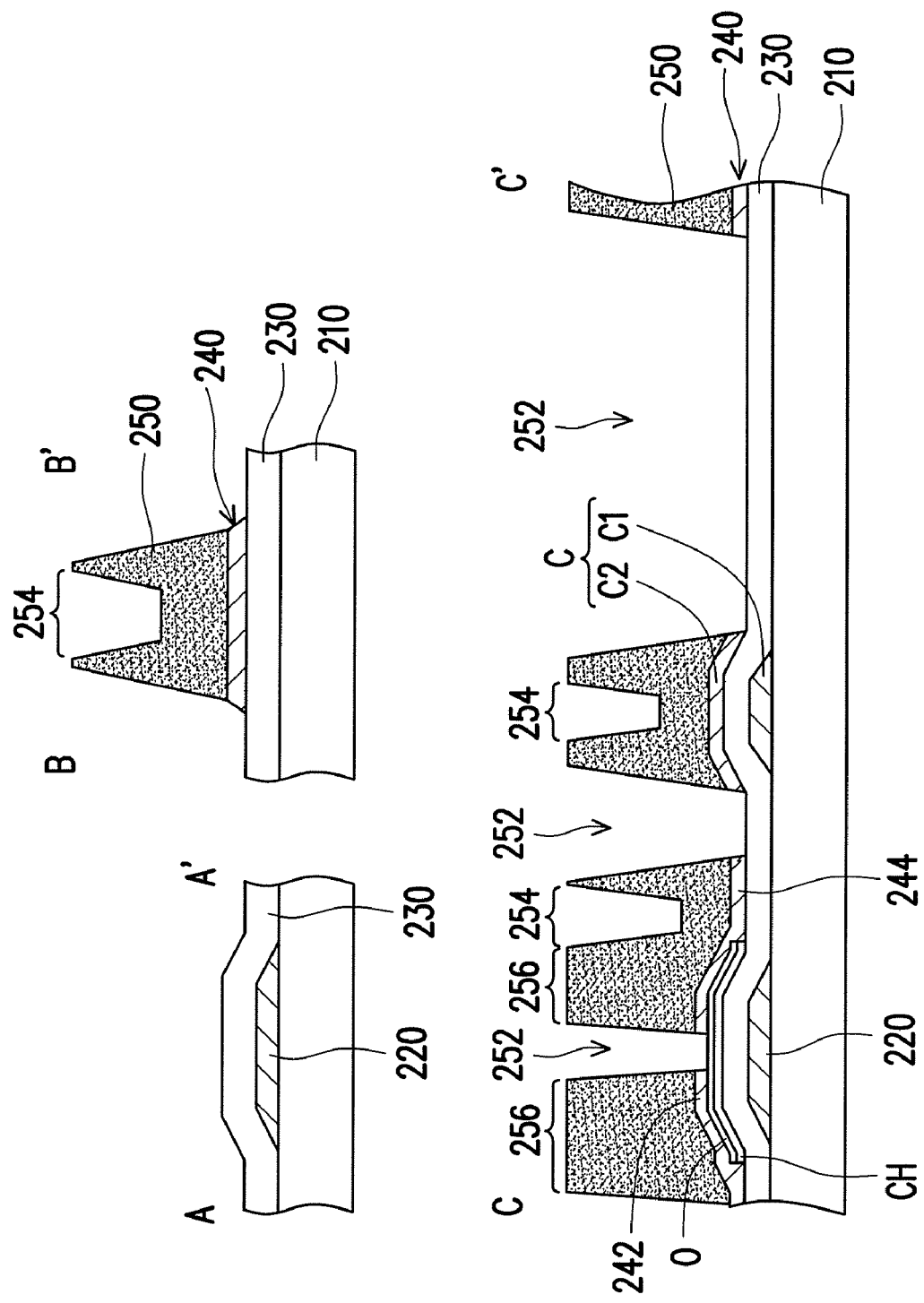

Thereafter, referring to FIG. 2C, a conductive layer 240 is formed on the channel layer CH and the gate insulation layer 230. Then, referring to FIG. 2C again, a photosensitive black matrix 250 is formed on the conductive layer 240, wherein the photosensitive black matrix 250 has at least one color filter layer accommodating opening 252. Besides, the photosensitive black matrix 250 includes a first block 254 and a second block 256, and the thickness T1 of the first block 254 is smaller than the thickness T2 of the second block 256. The photosensitive black matrix 250 may be made of photosensitive black resin.

Referring to FIG. 2C again, the photosensitive black matrix 250 may be formed through following steps. First, a photosensitive black resin layer (not shown) is formed on the conductive layer 240. Then, a half-tone mask S is provided, wherein the half-tone mask S has at least one transmissive region S1, at least one semi-transparent region S2, and at least one non-transmissive S3, wherein the transmittance of the semi-transparent region S2 is between the transmittance of the transmissive region S1 and the transmittance of the non-transmissive region S3. After that, the photosensitive black resin layer is exposed and developed by using the half-tone mask S to form the photosensitive black matrix 250.

Figure 2E:
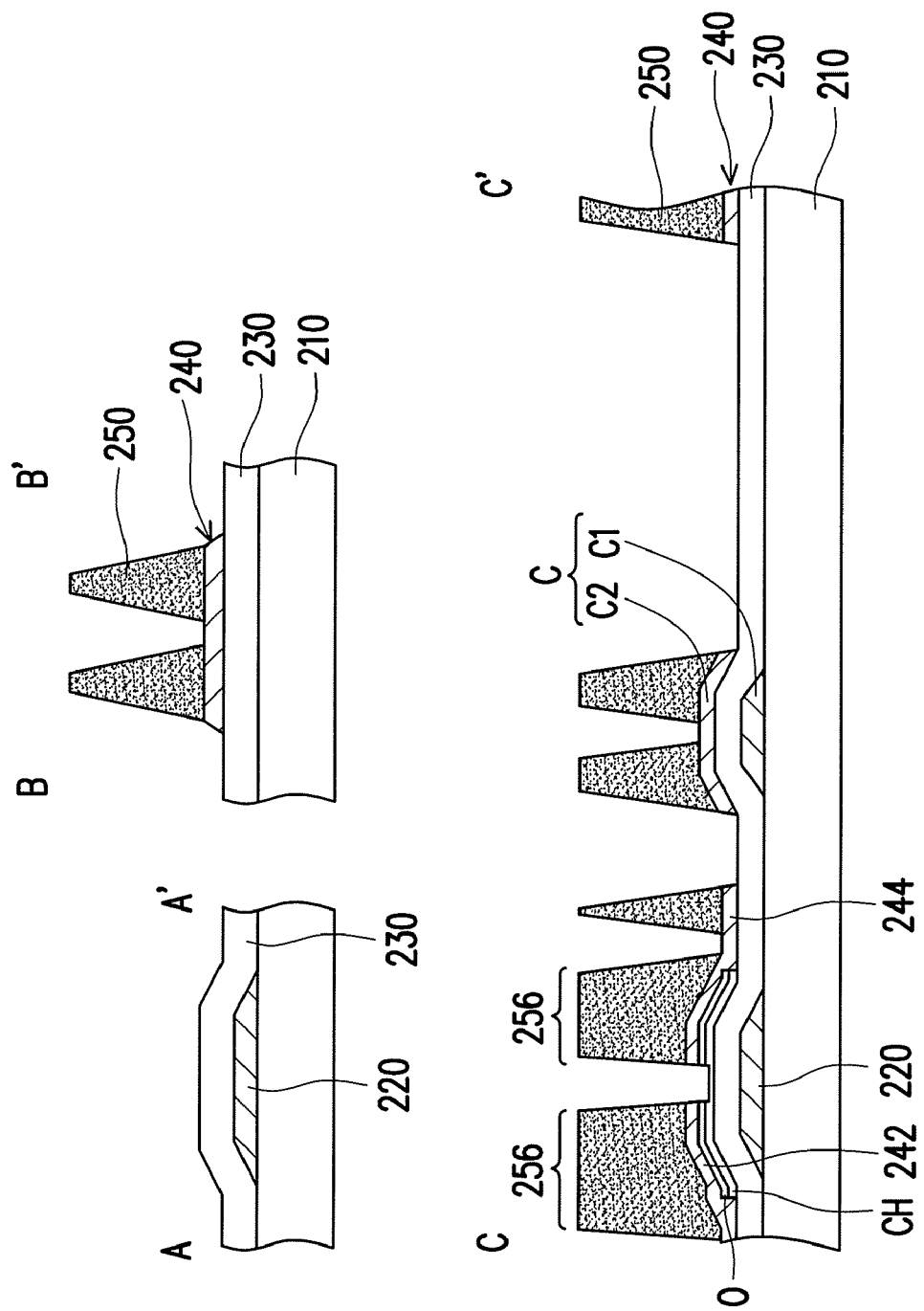
Figure 3C:
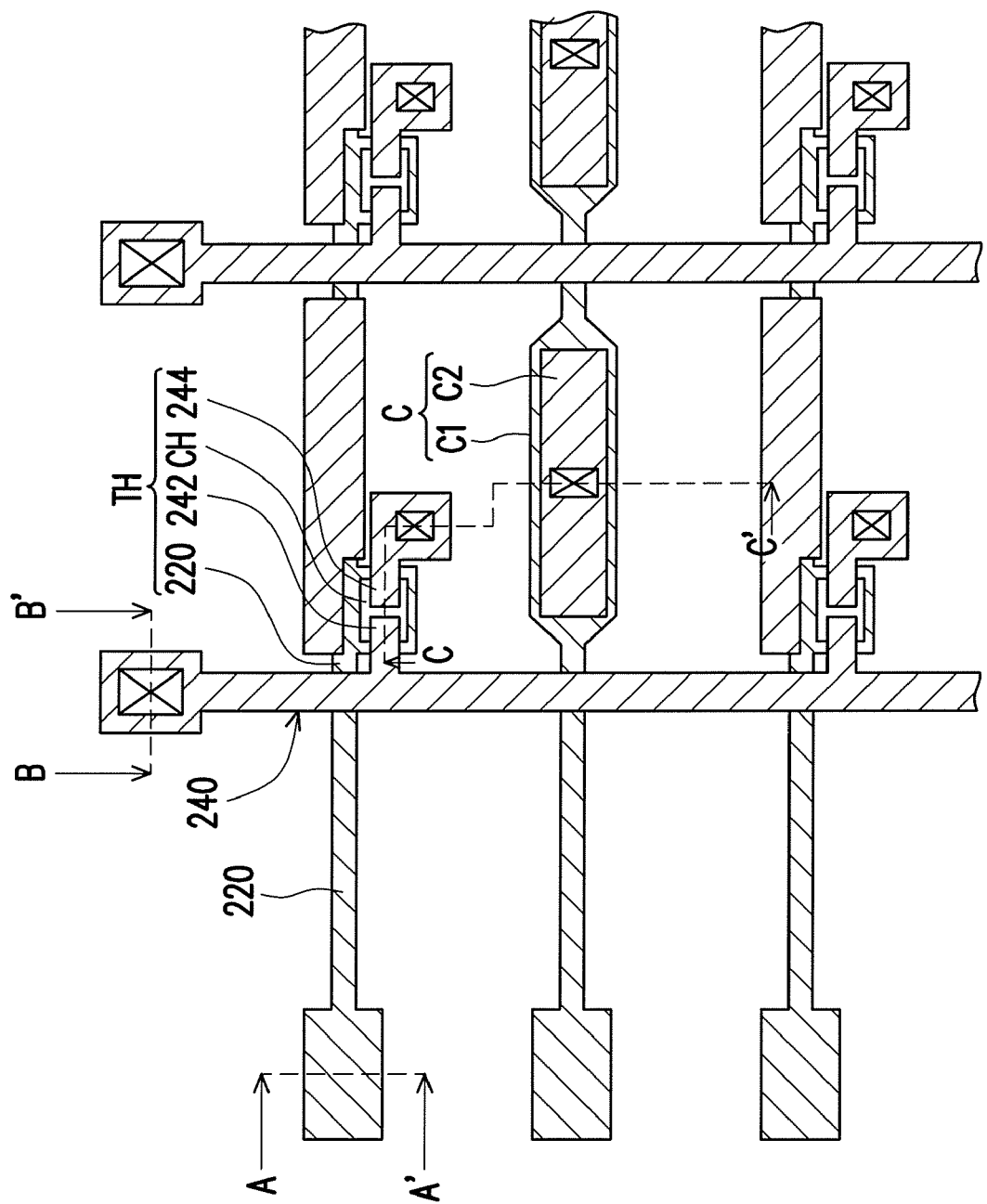

Next, referring to FIG. 2E and FIG. 3C, the conductive layer 240 is patterned with the photosensitive black matrix 250 as a mask to form a source 242 and a drain 244 on the channel layer CH. The gate 220, the channel layer CH, the source 242, and the drain 244 form a TFT TH. It should be noted that in the present embodiment, the conductive layer 240 is patterned by using the photosensitive black matrix 250 as a mask. Thus, fewer PEPs are performed in the present embodiment and accordingly the fabricating cost of the pixel structure is reduced. In addition, in the present embodiment, a second capacitance electrode C2 may be selectively formed while patterning the conductive layer 240, wherein the first capacitance electrode C1 and the second capacitance electrode C2 form a storage capacitor C.

In the present embodiment, the conductive layer 240 may be patterned through following steps. First, referring to FIG. 2D, part of the conductive layer 240 not covered by the photosensitive black matrix 250 is removed with the photosensitive black matrix 250 as a mask to form the source 242 and the drain 244 on the channel layer CH. The conductive layer 240 not covered by the photosensitive black matrix 250 may be removed through a wet etching process. Then, referring to FIG. 2E, the ohmic contact layer O on the channel layer CH is removed, and the thickness of the photosensitive black matrix 250 is reduced until the first block 254 is completely removed and part of the conductive layer 240 is exposed. The step of removing the ohmic contact layer O on the channel layer CH and reducing the thickness of the photosensitive black matrix 250 includes performing a dry etching process to the ohmic contact layer O and the photosensitive black matrix 250, wherein the dry etching process performed to the photosensitive black matrix 250 may be an ashing process.

Figure 2F:
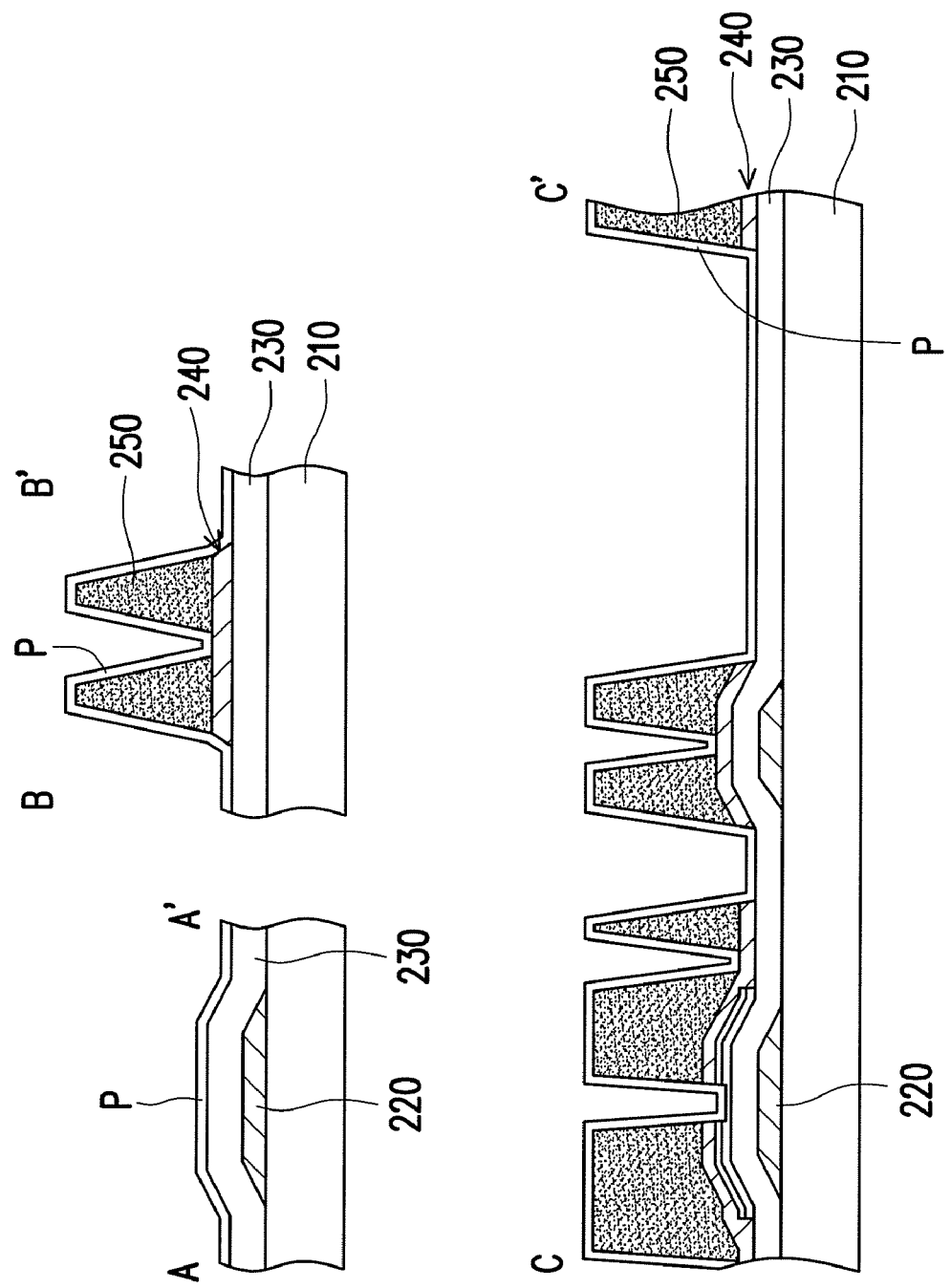

After that, referring to FIG. 2F, a protecting layer P may be selectively formed on the photosensitive black matrix 250, the TFT TH, and the gate insulation layer 230 to protect the conductive layer 240 exposed by the photosensitive black matrix 250. The protecting layer P may be made of an inorganic dielectric material, such as Silicon oxide, Silicon nitride, and Silicon oxide nitride. To be more specific, the protecting layer P may be formed through physical vapour deposition (PVD) or CVD.

Figure 2G:
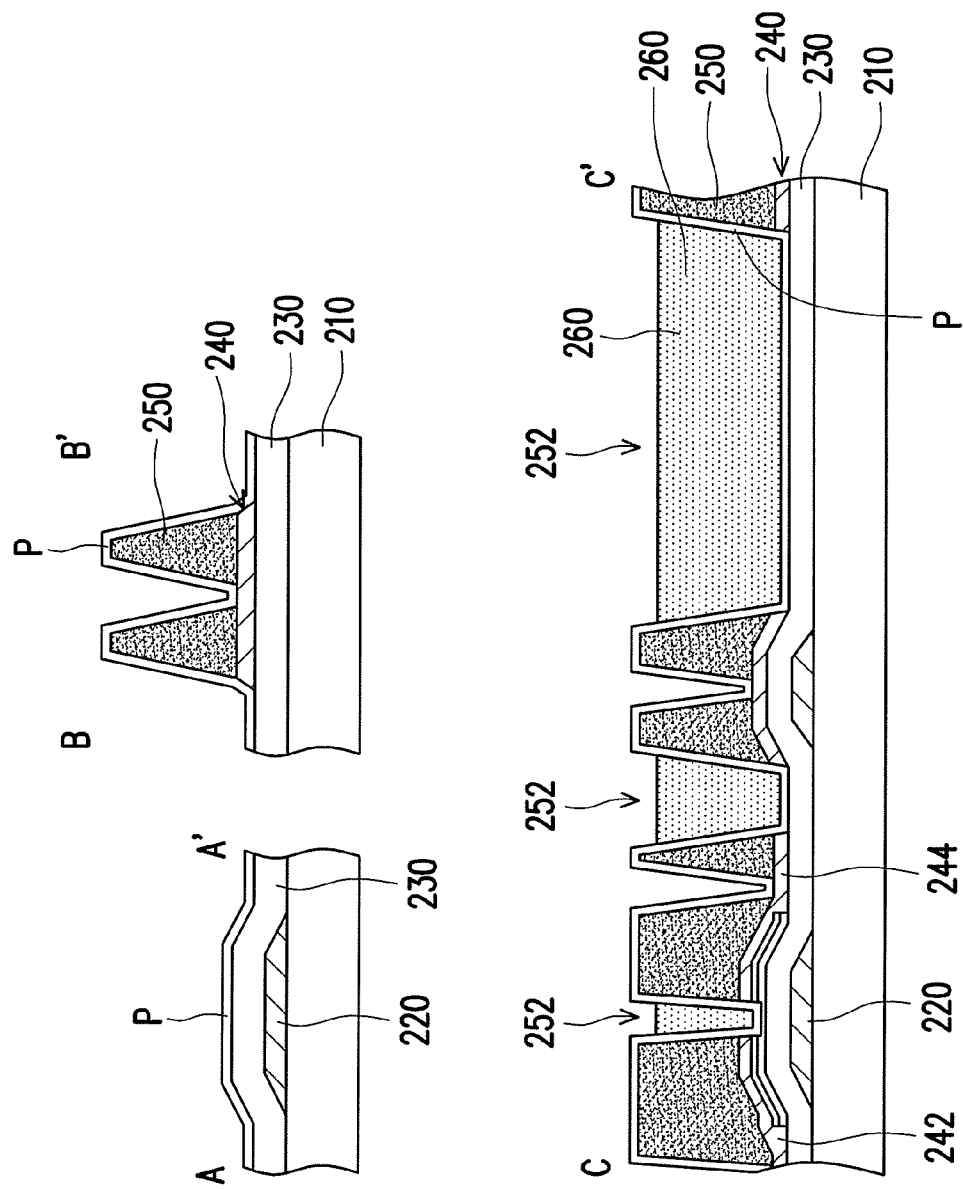
Figure 3D:
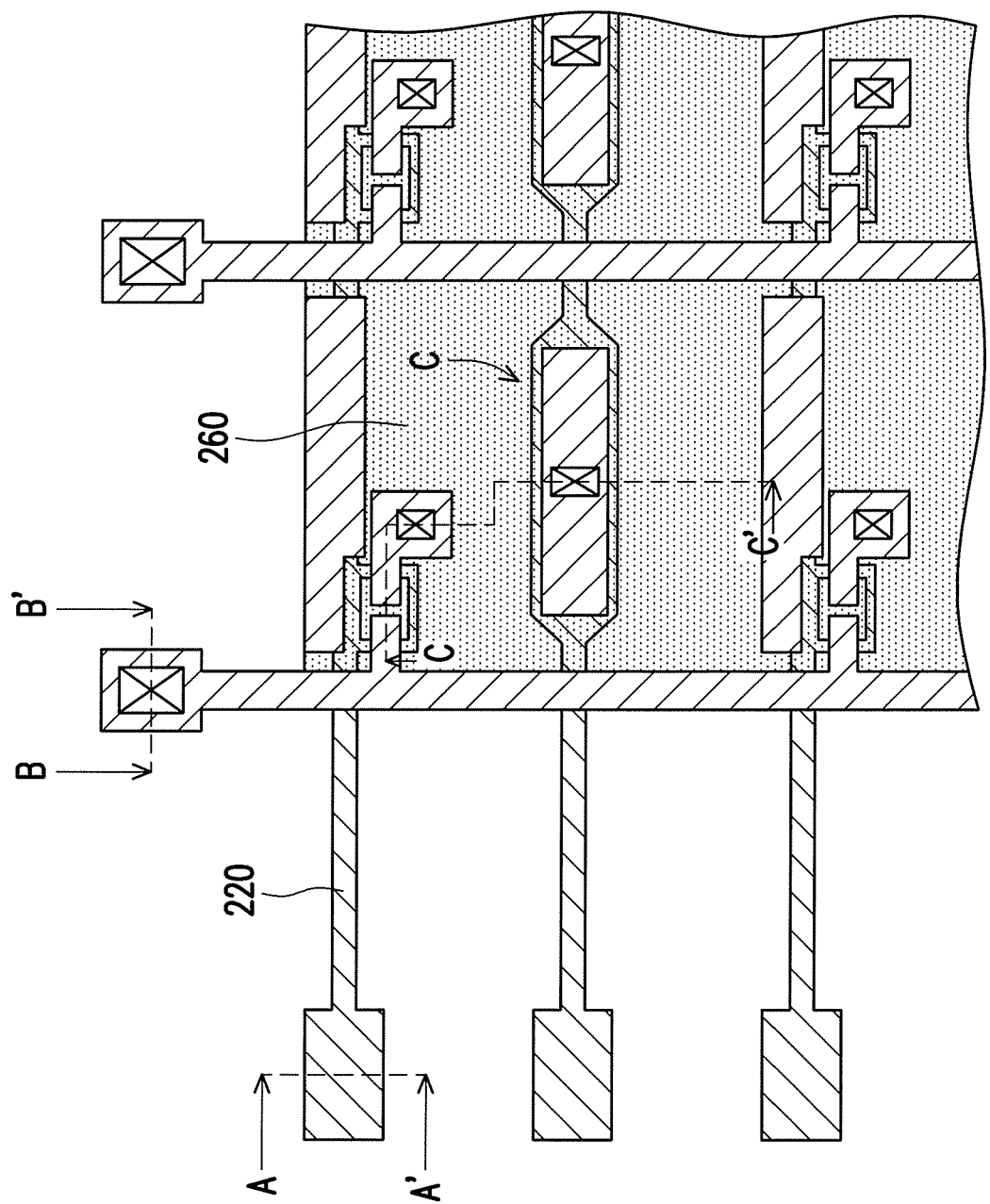
Figure 3E:
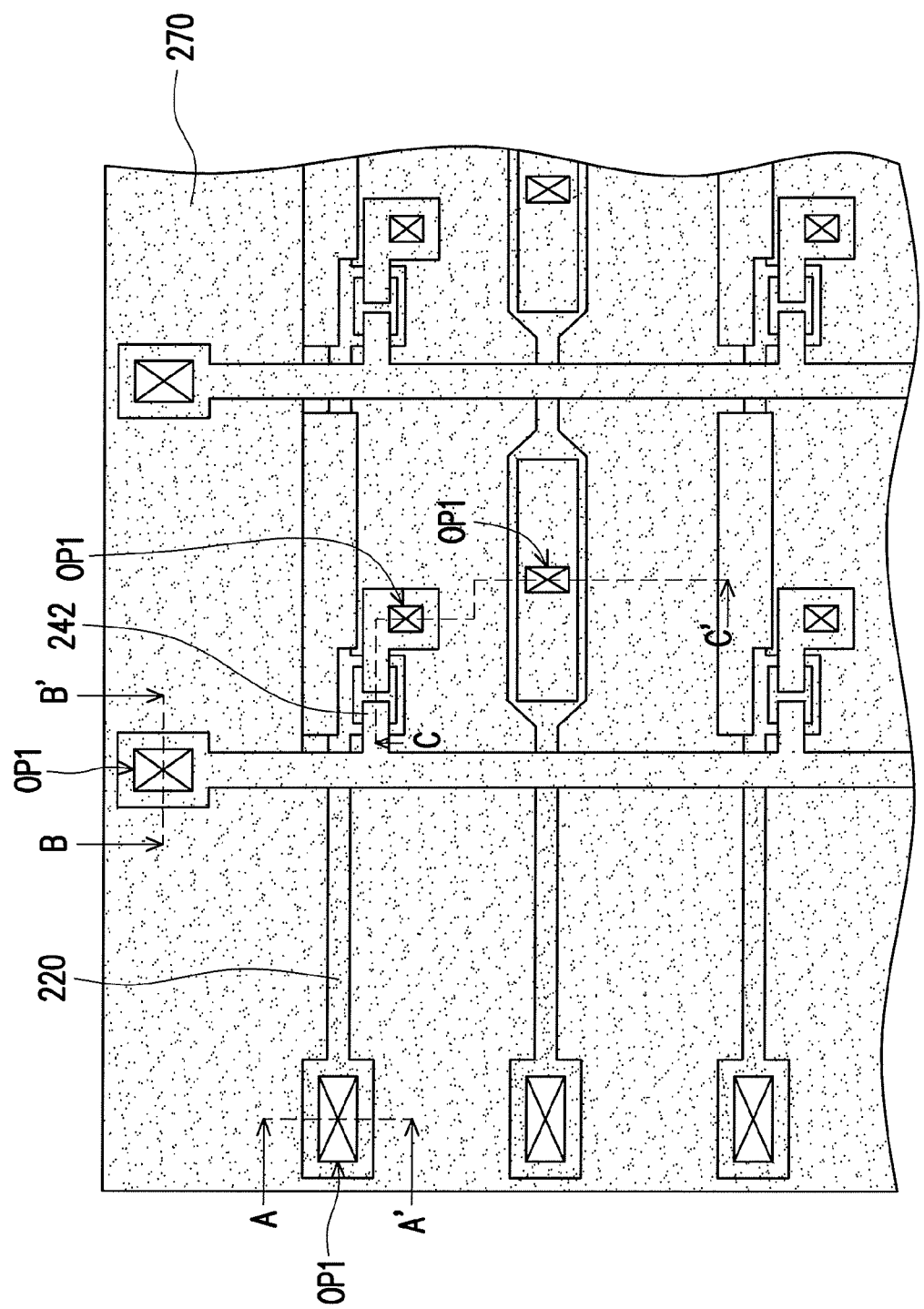

Next, referring to FIG. 2G and FIG. 3D, a color filter layer 260 is formed within the color filter layer accommodating opening 252 through an inkjet printing process. The color filter layer 260 may be made of acrylic resin. Substantially, in the technique for directly integrating the color filter layer into a TFT array substrate, each pixel structure has a color filter layer 260 located above the TFT TH, and the color filter layer 260 may include a red color filter pattern, a green color filter pattern, and a blue color filter pattern to allow an LCD panel to achieve a full-color display effect.

To be more specific, the color filter layer 260 may be a red color filter pattern, a green color filter pattern, or a blue color filter pattern. Besides, the inkjet printing process may include following steps. First, a surface treatment is performed to the substrate 210, and then, a nozzle filled with red, green, or blue ink is used for filling the ink into the predetermined red, green, or blue color filter layer accommodating opening 252. After that, a baking process is performed to solidify the ink and form the color filter layer 260.

It should be noted that in the present embodiment, the color filter layer 260 is formed through an inkjet printing process instead of the PEP in the conventional technique. Thus, in the present embodiment, the fabricating cost is greatly reduced, the fabricating process is simplified, and accordingly the production yield is improved. In addition, compared to the conventional technique wherein the red, green, and blue color filter layers 260 have to be formed individually, the present embodiment offers a shortened process time by forming these color filter layers 260 simultaneously. However, the color, number, and disposition of the color filter patterns are not limited in the present invention; instead, they can be adjusted according to the actual requirement.

Figure 2H:
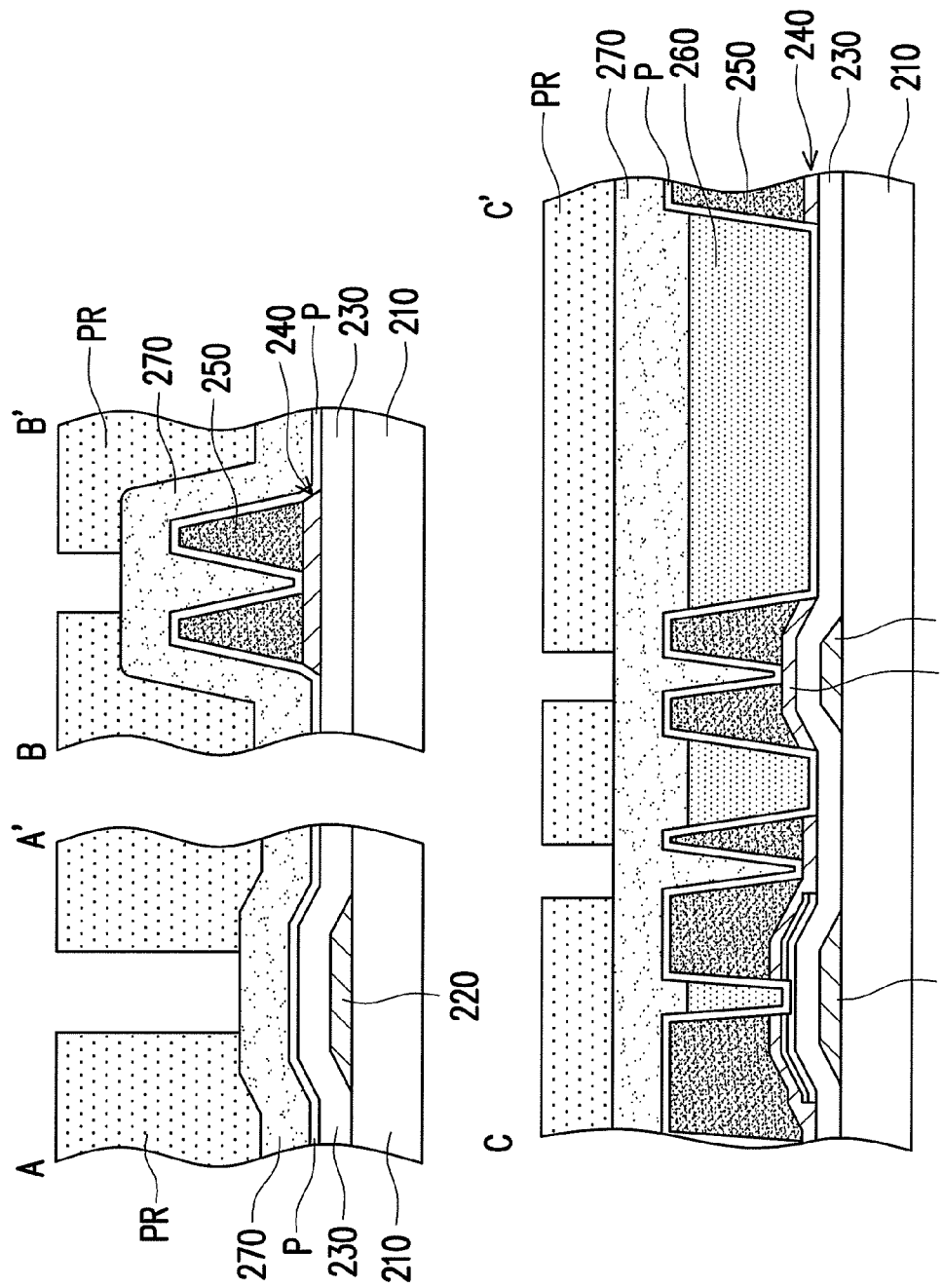
Figure 2I:
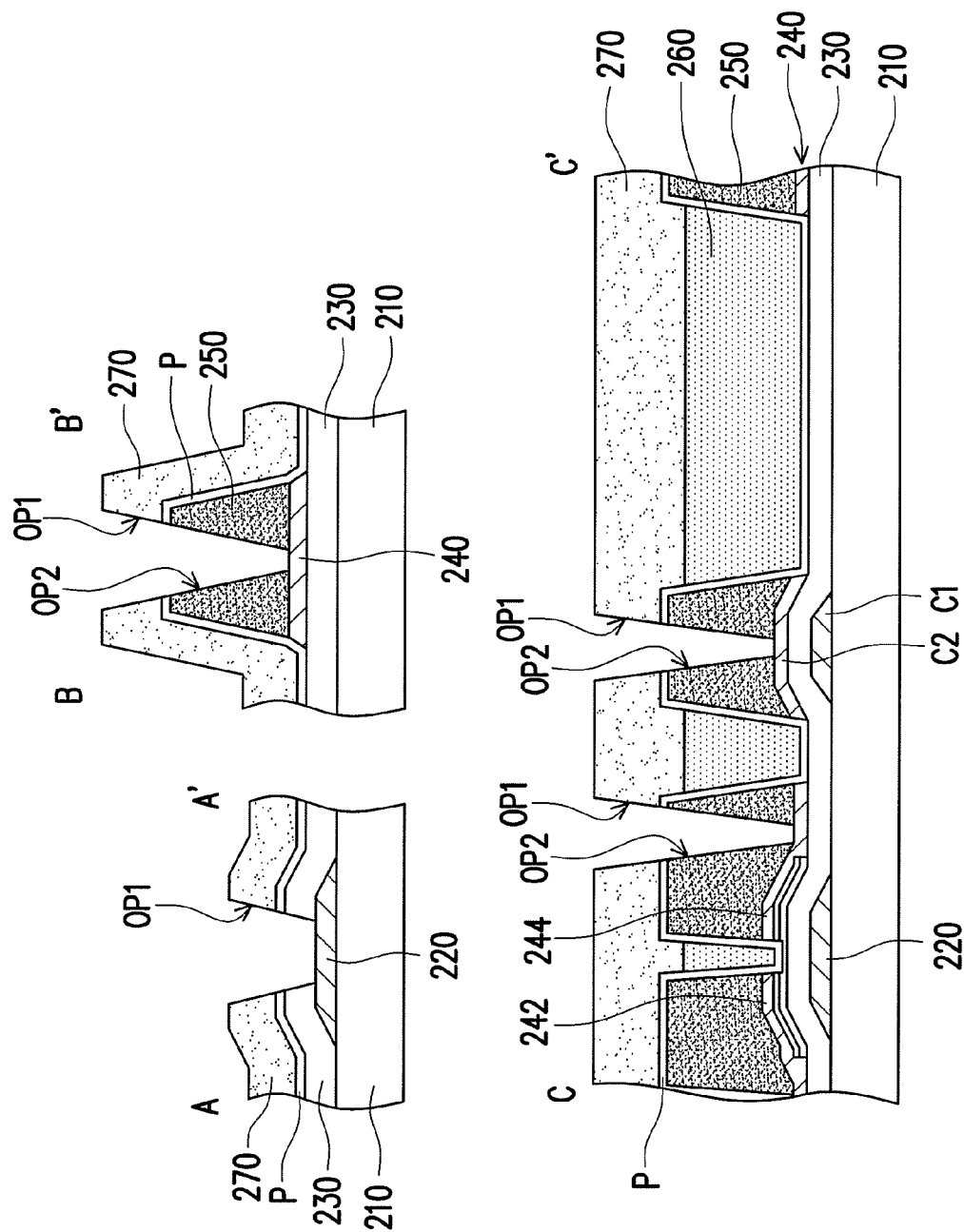

Next, referring to FIG. 2H, a dielectric layer 270 is formed on the photosensitive black matrix 250 and the color filter layer 260, wherein the dielectric layer 270 may be made of an organic dielectric material, such as acrylic resin and photosensitive resin, and the dielectric layer 270 may be formed through photoresist coating. After that, referring to FIG. 2I and FIG. 3E, the dielectric layer 270 is patterned to expose the drain 244. To be specific, the dielectric layer 270 may be patterned through following steps. First, referring to FIG. 2H, a photoresist layer PR is formed on the dielectric layer 270. Then, referring to FIG. 2I, part of the dielectric layer 270, part of the protecting layer P, and part of the photosensitive black matrix 250 are removed with the photoresist layer PR as a mask to respectively form a first opening OP1 and a second opening OP2 in the dielectric layer 270 and the photosensitive black matrix 250. Besides, the first opening OP1 and the second opening OP2 expose the drain 244 and the second capacitance electrode C2. After that, the photoresist layer PR is removed.

Figure 2J:
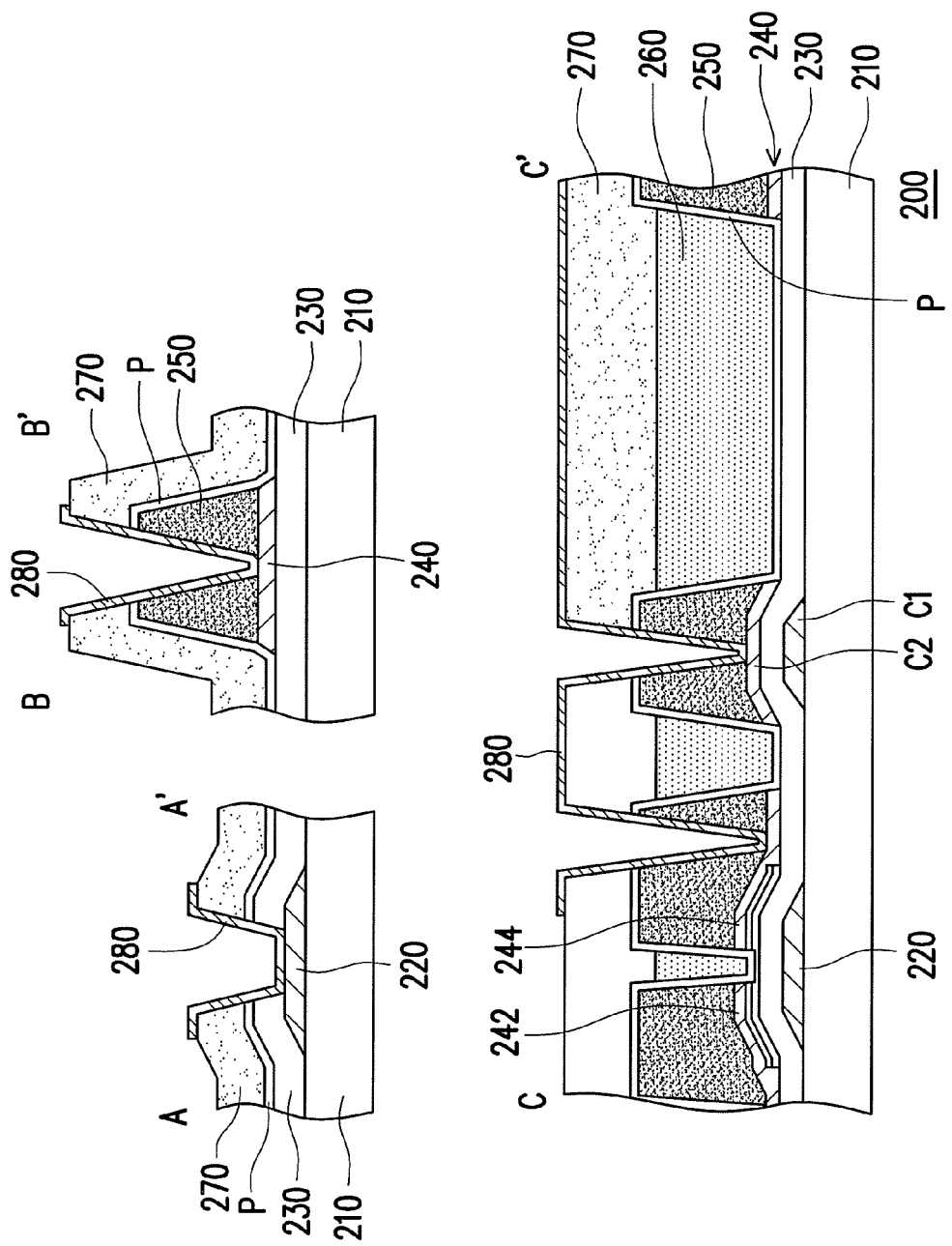
Figure 3F:
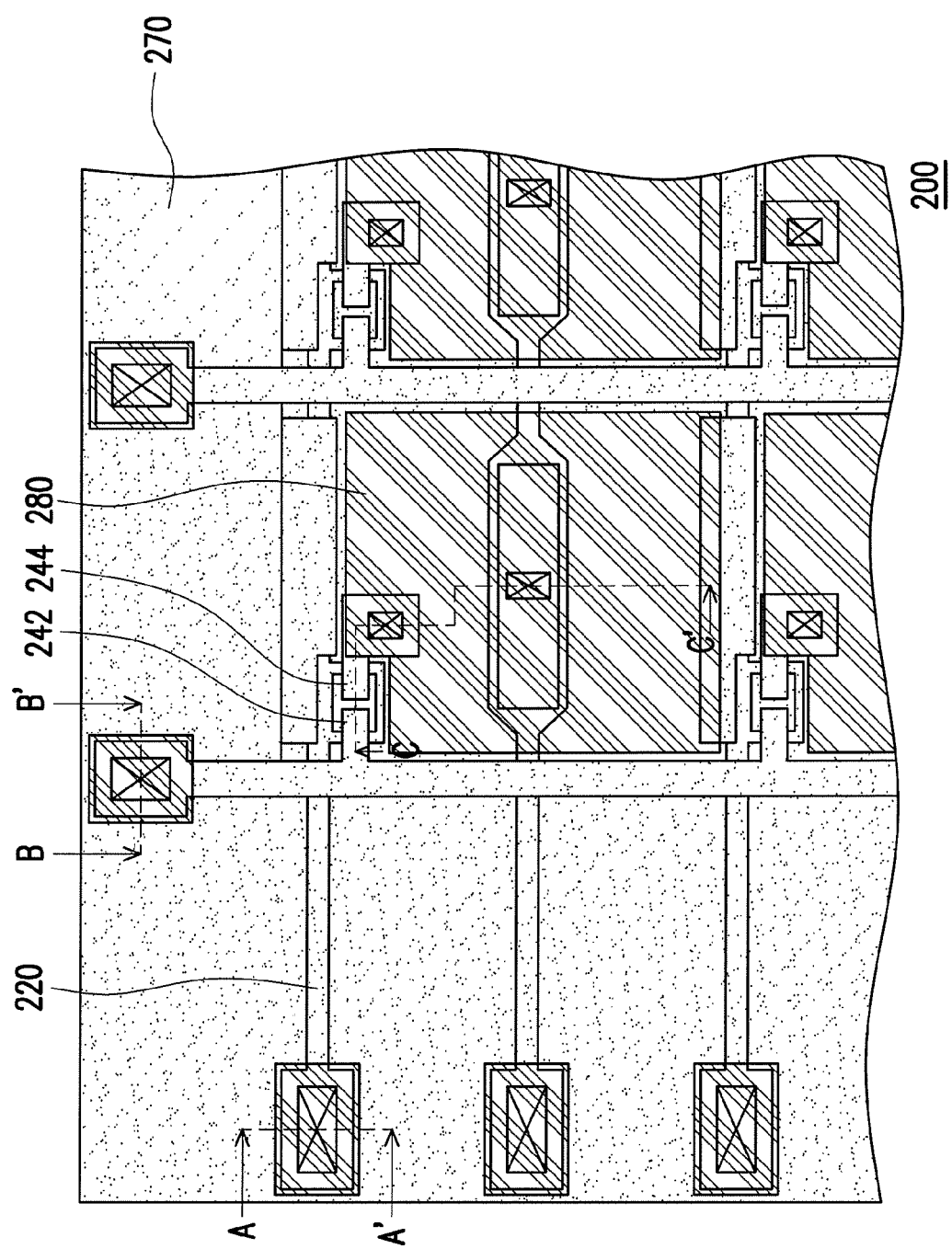

Referring to FIG. 2J and FIG. 3F, a pixel electrode 280 electrically connected to the drain 244 is formed. In the present embodiment, the pixel electrode 280 is electrically connected to the second capacitance electrode C2 through the first opening OP1 and the second opening OP2 so that the first capacitance electrode C1, the gate insulation layer 230, and the pixel electrode 280 form a metal/insulator/ITO (MII) storage capacitor. The pixel electrode 280 may be formed by first forming an electrode material layer (not shown) on the dielectric layer 270, the photosensitive black matrix 250, and the drain 244 and then patterning the electrode material layer, wherein the electrode material layer may be an indium tin oxide (ITO) layer or an indium zinc oxide (IZO) layer formed through sputtering.

A pixel structure 200 is fabricated through foregoing steps illustrated in FIGS. 2A~2J. It should be noted that unlike the conventional technique which requires at least seven PEPs for fabricating the pixel electrode 200, the color filter layer 260 can be directly integrated into the TFT TH array substrate 210 through only five PEPs and an inkjet printing process in the present embodiment. Thus, the present embodiment offers a simplified fabricating process and reduces the fabricating cost. Moreover, in the present embodiment, the color filter layer 260 is formed through an inkjet printing process. Thus, the material used for forming the color filter layer 260 is effectively reduced and accordingly the fabricating cost of the pixel structure is further reduced.

Figure 4:
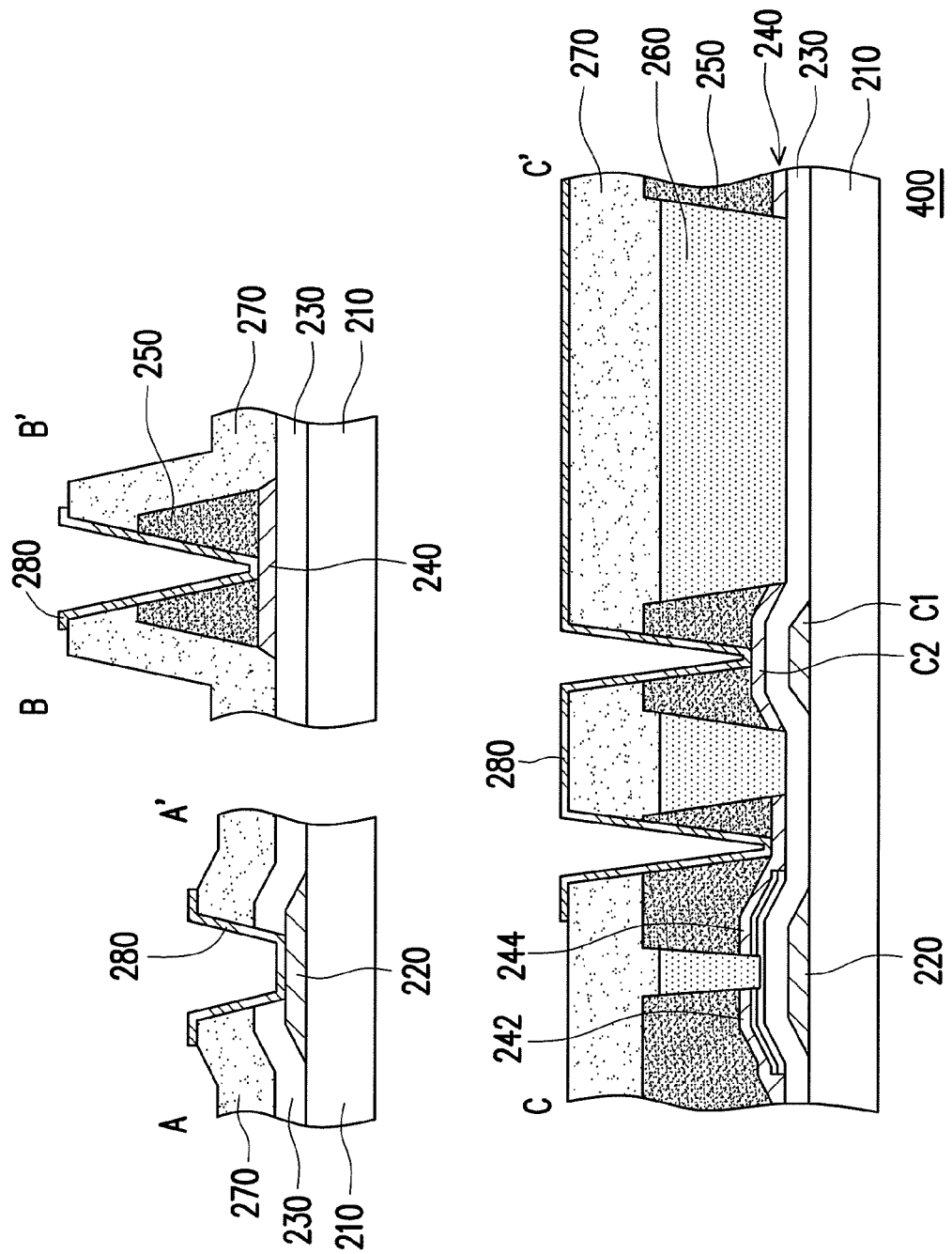
FIG. 4 is a cross-sectional view of a pixel structure according to another embodiment of the present invention.

FIG. 4 is a cross-sectional view of a pixel structure according to another embodiment of the present invention. Referring to FIG. 4, in the present embodiment, the pixel structure 400 is similar to the pixel structure 200 (as shown in FIG. 2J), and the difference between the two is that the pixel structure 400 does not have any protecting layer.

In overview, the pixel structure fabricating method provided by the present invention has at least following advantages:

1. according to the pixel structure fabricating method provided by the present invention, no PEP is performed for forming the color filter layer. Thus, the fabricating cost of high-precision masks used in the PEP can be skipped;

2. since the process for fabricating a pixel structure is simplified, defects caused during the PEPs (such as photoresist coating, soft baking, hard baking, exposing, developing, and photoresist removing etc) can be avoided;

3. since the color filter layer is formed through an inkjet printing process, compared to the conventional technique wherein a PEP is performed for the same purpose, the material used for forming the color filter layer is effectively reduced and accordingly the fabricating cost of the pixel structure is also reduced; and 4. in the present invention, the conductive layer is etched with a photosensitive black matrix as a mask. Thus, fewer PEPs are performed and according the fabricating cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure fabricating method, comprising:
    forming a gate on a substrate;
    forming a gate insulation layer on the gate;
    forming a channel layer on the gate insulation layer;
    forming a conductive layer on the channel layer and the gate insulation layer;
    forming a photosensitive black matrix on the conductive layer, wherein the photosensitive black matrix has a color filter layer accommodating opening, the photosensitive black matrix includes a first block and a second block, and the thickness of the first block is smaller than the thickness of the second block;
    patterning the conductive layer with the photosensitive black matrix as a mask to form a source and a drain on the channel layer, wherein the gate, the channel layer, the source, and the drain form a thin film transistor (TFT);
    forming a color filter layer within the color filter layer accommodating opening through an inkjet printing process;
    forming a dielectric layer on the photosensitive black matrix and the color filter layer;
    patterning the dielectric layer to expose the drain; and
    forming a pixel electrode electrically connected to the drain.

2. The pixel structure fabricating method according to claim 1, further comprising forming a protecting layer on the photosensitive black matrix, the TFT, and the gate insulation layer.

3. The pixel structure fabricating method according to claim 1, wherein the step of patterning the conductive layer comprises:
    removing part of the conductive layer not covered by the photosensitive black matrix with the photosensitive black matrix as a mask to form the source and the drain on the channel layer; and
    reducing the thickness of the photosensitive black matrix until the first block is completely removed.

4. The pixel structure fabricating method according to claim 3, wherein the step of removing part of the conductive layer not covered by the photosensitive black matrix comprises performing a wet etching process.

5. The pixel structure fabricating method according to claim 3, wherein the step of reducing the thickness of the photosensitive black matrix comprises performing a dry etching process.

6. The pixel structure fabricating method according to claim 5, wherein the dry etching process comprises an ashing process.

7. The pixel structure fabricating method according to claim 1, wherein the step of forming the channel layer comprises:
    forming a semiconductor material layer on the gate insulation layer; and
    patterning the semiconductor material layer to form a semiconductor layer.

8. The pixel structure fabricating method according to claim 7, further comprising forming an ohmic contact layer on the semiconductor layer.

9. The pixel structure fabricating method according to claim 8, wherein the step of patterning the conductive layer comprises:
    removing part of the conductive layer not covered by the photosensitive black matrix with the photosensitive black matrix as a mask to form the source and the drain on the channel layer; and
    removing the ohmic contact layer on the channel layer, and reducing the thickness of the photosensitive black matrix until the first block is completely removed.

10. The pixel structure fabricating method according to claim 9, wherein the step of removing the ohmic contact layer on the channel layer and reducing the thickness of the photosensitive black matrix comprises performing a dry etching process.

11. The pixel structure fabricating method according to claim 1, wherein the step of patterning the dielectric layer comprises:
    forming a photoresist layer on the dielectric layer; and
    removing part of the dielectric layer and part of the photosensitive black matrix with the photoresist layer as a mask to form a first opening and a second opening in the dielectric layer and the photosensitive black matrix, respectively.

12. The pixel structure fabricating method according to claim 1, wherein the step of forming the pixel electrode comprises:
    forming an electrode material layer on the dielectric layer, the photosensitive black matrix, and the drain; and
    patterning the electrode material layer.

13. The pixel structure fabricating method according to claim 1, wherein a first capacitance electrode is further formed while forming the gate, a second capacitance electrode is further formed while forming the source and the drain, and the first capacitance electrode and the second capacitance electrode form a storage capacitor.

* * * * *